US008704256B2

(12) United States Patent
Sekii et al.

(10) Patent No.: US 8,704,256 B2
(45) Date of Patent: Apr. 22, 2014

(54) LENS-MOUNTED LIGHT EMITTING UNIT

(75) Inventors: Hiroyuki Sekii, Osaka (JP); Yoko Matsubayashi, Sakai (JP); Kenichiro Tanaka, Neyagawa (JP)

(73) Assignee: Panasonic Corporation, Osaka (JP)

( * ) Notice: Subject to any disclaimer, the term of this patent is extended or adjusted under 35 U.S.C. 154(b) by 248 days.

(21) Appl. No.: 12/989,174

(22) PCT Filed: Apr. 16, 2009

(86) PCT No.: PCT/JP2009/057634
§ 371 (c)(1),
(2), (4) Date: Oct. 22, 2010

(87) PCT Pub. No.: WO2009/131050
PCT Pub. Date: Oct. 29, 2009

(65) Prior Publication Data
US 2011/0037084 A1    Feb. 17, 2011

(30) Foreign Application Priority Data
Apr. 24, 2008    (JP) .................................. 2008-113516

(51) Int. Cl.
*H01L 33/00*    (2010.01)

(52) U.S. Cl.
USPC ........................................................ 257/98

(58) Field of Classification Search
USPC ........ 257/89, 98, 99, 100, E33.001, E33.067, 257/E33.072, E33.073
See application file for complete search history.

(56) References Cited

U.S. PATENT DOCUMENTS

2002/0080615 A1    6/2002    Marshall et al.
2005/0152127 A1    7/2005    Kamiya et al.
2007/0114551 A1*   5/2007    Kawaguchi et al. ............ 257/98
2008/0266893 A1*  10/2008    Speier ........................... 362/551
2009/0002987 A1*   1/2009    Riemeijer et al. ............. 362/247
2009/0046454 A1*   2/2009    Bertram et al. ................ 362/231

FOREIGN PATENT DOCUMENTS

| JP | 60-130001   |   | 7/1985  |
|----|-------------|---|---------|
| JP | 10-290028   |   | 10/1998 |
| JP | 2002-133932 | * | 5/2002  |
| JP | 2004-335524 |   | 11/2004 |
| JP | 2007-5218   |   | 1/2007  |
| JP | 2007-227679 |   | 9/2007  |
| JP | 2008-84989  |   | 4/2008  |

OTHER PUBLICATIONS

EPO Search Report dated Sep. 18, 2013.

* cited by examiner

*Primary Examiner* — Vongsavanh Sengdara
(74) *Attorney, Agent, or Firm* — Greenblum & Bernstein P.L.C.

(57) ABSTRACT

In a lens-mounted light emitting unit comprising LED elements of multiple light colors, narrow-angle light distribution is enabled, and color mixing properties are improved. The lens-mounted light emitting unit comprises LED elements of multiple light colors placed on a base plate, and a lens unit having a shape of a body of revolution to color-mix and emit the light from the LED elements. Assuming an arbitrary contact point between the side incident surface and the upper incident surface of the lens unit, and that light from an LED element farthest from the contact point is refracted at the contact point to form a light path intersecting the emitting surface at an intersection point, the emitting surface inside a circle formed by continuously connecting such intersection points has a diffusion angle larger than the diffusion angle of the emitting surface outside the circle. This enables narrow-angle light distribution, and makes it possible to improve color mixing properties.

3 Claims, 10 Drawing Sheets

LIGHT PATH PASSING THROUGH UPPER INCIDENT SURFACE

LIGHT PATH PASSING THROUGH SIDE INCIDENT SURFACE

LIGHT PATH PASSING THROUGH
UPPER INCIDENT SURFACE

LIGHT PATH PASSING THROUGH
SIDE INCIDENT SURFACE

CENTER OF GRAVITY

LIGHT PATH PASSING THROUGH
UPPER INCIDENT SURFACE

LIGHT PATH PASSING THROUGH
SIDE INCIDENT SURFACE

DIFFUSION MEANS PRESENT

LIGHT PASSING THROUGH
EMITTING SURFACE INSIDE C1

DIFFUSION MEANS PRESENT

LIGHT PASSING THROUGH
EMITTING SURFACE OUTSIDE C1

DIFFUSION MEANS ABSENT

LIGHT PASSING THROUGH
EMITTING SURFACE INSIDE C1

DIFFUSION MEANS ABSENT

LIGHT PASSING THROUGH
EMITTING SURFACE OUTSIDE C1

LIGHT PATH PASSING THROUGH UPPER INCIDENT SURFACE

LIGHT PATH PASSING THROUGH UPPER INCIDENT SURFACE AND SUBSTANTIALLY PARALLEL TO LENS CENTER AXIS

DIFFUSION MEANS PRESENT
LIGHT PASSING THROUGH EMITTING SURFACE INSIDE C2

DIFFUSION MEANS PRESENT
LIGHT PASSING THROUGH EMITTING SURFACE OUTSIDE C2 AND INSIDE C1

DIFFUSION MEANS ABSENT
LIGHT PASSING THROUGH EMITTING SURFACE INSIDE C2

DIFFUSION MEANS ABSENT
LIGHT PASSING THROUGH EMITTING SURFACE OUTSIDE C2 AND INSIDE C1

LIGHT PATH PASSING
THROUGH UPPER INCIDENT
SURFACE

LIGHT PATH OF LIGHT PASSING
THROUGH UPPER INCIDENT
SURFACE AND SUBSTANTIALLY
PARALLEL TO LENS CENTER
AXIS, AND LIGHT PASSING
THROUGH FOCAL POINT OF
CONVEX LENS

LIGHT PASSING THROUGH
EMITTING SURFACE INSIDE C3

LIGHT PASSING THROUGH
EMITTING SURFACE OUTSIDE C3
AND INSIDE C1

LIGHT PASSING THROUGH
EMITTING SURFACE INSIDE C3

LIGHT PASSING THROUGH
EMITTING SURFACE OUTSIDE C3
AND INSIDE C1

LIGHT PATH PASSING THROUGH
UPPER INCIDENT SURFACE

LENS-MOUNTED LIGHT EMITTING UNIT

TECHNICAL FIELD

The present invention relates to a lens-mounted light emitting unit using a lens to color-mix light emitted from LED elements of multiple light colors such as red, blue and green.

BACKGROUND ART

Conventionally, as described, for example, in Japanese Laid-open Patent Publication Hei 10-290028, a device for color-mixing light from single-color LEDs such as red, blue and green without color unevenness is known, in which all the light emitted from the LEDs is projected on a reflector for multiple reflection so as to extract only indirect light, thereby improving the color mixing properties of light. Further, as described, for example, in Japanese Laid-open Patent Publication 2002-133932, a device is proposed, in which a light guide member and a diffusion layer are added so as to emit light from each LED in one direction by using the total reflection of the light guide member, and to uniformly increase the scattering properties by using the diffusion layer, thereby improving the color mixing properties of the emitted lights.

However, in the color mixing using reflected light as described above, the amount of emitted light decreases as the number of reflections increases due to absorption by the reflecting surface, although the increase in the number of reflections improves the color mixing properties. Further, the emitted light is scattered at various angles, resulting in a wide-angle light distribution. Besides, if the diffusion layer is made of fine particles or the like, the diffusion properties are improved with their concentration, which however reduces transmittance. Further, the emitted light is scattered at various angles, resulting in a wide-angle light distribution.

Further, as described, for example, in Japanese Laid-open Patent Publication Sho 60-130001, a condenser lens formed by combining a convex incident surface and a total reflection surface is proposed to change the wide-angle light distribution of an LED element to narrow-angle light distribution so as to increase intensity. The condenser lens has two kinds of light paths: a light path to allow the incident light on the lens from the centrally placed LED element to be emitted as substantially parallel light relative to the lens center axis (optical axis) based on the total reflection by the reflecting surface; and a light path to allow the incident light to be collected and emitted as substantially parallel light relative to the optical axis based on the refraction by the convex incident surface. A light source unit of narrow-angle light distribution to emit substantially parallel light relative to the optical axis is achieved by the both light paths. In the case of using one LED element, the central placement of the LED element allows the light emitted from the LED element to be refracted by the convex incident surface and to be emitted as substantially parallel light which is symmetrical relative to the lens center axis.

However, if multiple LED elements are used, it is not possible to centrally place one LED element. Thus, if multiple single-color LED elements are used for the condenser lens, the positions of the LED elements of multiple light colors are offset on one side, respectively, relative to the lens center axis, so that paths of light emitted from the respective LED elements and passing through the convex incident surface are asymmetrical relative to the lens center axis, causing color unevenness. Further, even if the convex incident surface is flat, such axial asymmetry remains, causing color unevenness.

SUMMARY OF THE INVENTION

Problem to be Solved by the Invention

In order to solve the above-described problems, the object of the present invention is to enable narrow-angle light distribution and improve color mixing properties in a lens-mounted light emitting unit comprising LED elements of multiple light colors.

Means for Solving the Problem

In order to solve the above-described problems, the present invention provides a lens-mounted light emitting unit comprising: a base plate; multiple LED elements placed on the base plate; and a lens unit having a shape of a body of revolution about a normal line of the base plate as a symmetry axis of revolution which passes through substantially the center of gravity of the multiple LED elements, in which the multiple LED elements include LED elements of multiple light colors, while the lens unit color-mixes and emits light from the LED elements, wherein the lens unit comprises: an emitting surface perpendicular to the normal line of the base plate; a reflecting surface extending convexly toward the base plate from the emitting surface; a side incident surface which is replicated toward the emitting surface from an end of the base plate side of the reflecting surface; and an upper incident surface which bounds an end of the side incident surface which does not contact with the reflecting surface, and wherein, assuming an arbitrary contact point between the side incident surface and the upper incident surface, and that light from an LED element farthest from the contact point is refracted at the contact point to form a light path intersecting the emitting surface at an intersection point, the emitting surface inside a circle with a radius formed by continuously connecting such intersection points has a diffusion angle larger than the diffusion angle of the emitting surface outside the circle.

According to this structure, sufficient color mixing of light incident on the upper incident surface is achieved while enabling narrow-angle light distribution by a condenser lens, making it possible to improve the color mixing properties of the light emitting unit, because, assuming an arbitrary contact point between the side incident surface and the upper incident surface, and that light from an LED element farthest from the contact point is refracted at the contact point to form a light path intersecting the emitting surface at an intersection point, the emitting surface inside a circle with a radius formed by continuously connecting such intersection points has a diffusion angle larger than the diffusion angle of the emitting surface outside the circle.

According to the present invention, it is preferable in the improved invention described above that the upper incident surface is a flat surface perpendicular to the normal line, and the diffusion angle of the emitting surface inside the circle is larger in a peripheral area of the circle than in a central area of the circle.

According to this structure, the case where the upper incident surface is a flat surface perpendicular to a normal line of the base plate allows good color mixing properties in lens center, so that by reducing diffusion of such area, it is possible to improve the light collecting properties.

According to the present invention, it is preferable in the improved invention described above that the upper incident surface is a convex surface perpendicular to the normal line, and the diffusion angle of the emitting surface inside the circle is smaller in a peripheral area of the circle than in a central area of the circle.

According to this structure, the case where the upper incident surface is a convex surface perpendicular to a normal line of the base plate causes the light substantially parallel to the lens center axis to increase, resulting in light collection offset from the lens center axis and thus in most poor color mixing properties. However, the color mixing properties can be improved with a minimum diffusion angle by increasing the diffusion in a central area of the circle and by reducing the diffusion in a peripheral area of the circle.

BRIEF DESCRIPTION OF DRAWINGS

FIG. 2A is a cross-sectional view along line X-X' of FIG. 1, showing light path passing through an upper incident surface of the unit, while

FIG. 3A is a cross-sectional view showing light path passing through the upper incident surface in the case where diffusion means of the present embodiment is absent from an emitting surface, while

FIG. 4A is a graph of light distribution curves of light passing through the emitting surface inside a circle in the lens-mounted light emitting unit according to the first embodiment of the present invention, while

FIG. 5A is a graph of light distribution curves of light passing through the emitting surface inside the circle in the case where the diffusion means of the present embodiment is absent from the emitting surface, while

FIG. 8A is a cross-sectional view showing light path passing through an upper incident surface in the case where diffusion means of the present embodiment is absent from an emitting surface, while

FIG. 9A is a graph of light distribution curves of light passing through the emitting surface inside a circle in a central area thereof in the lens-mounted light emitting unit according to the second embodiment of the present invention, while

FIG. 10A is a graph of light distribution curves of light passing through the emitting surface inside the circle in the central area thereof in the case where the diffusion means of the present embodiment is absent from the emitting surface, while

FIG. 13A is a cross-sectional view showing light path passing through an upper incident surface in the case where diffusion means of the present embodiment is absent from an emitting surface, while

FIG. 14A is a graph of light distribution curves of light passing through the emitting surface inside a circle in a central area thereof in the lens-mounted light emitting unit according to the third embodiment of the present invention, while

FIG. 15A is a graph of light distribution curves of light passing through the emitting surface inside the circle in the central area thereof in the case where the diffusion means of the present embodiment is absent from the emitting surface, while

FIG. 16A is a top plan view of a modified example of the lens-mounted light emitting unit of the present invention, while

DESCRIPTION OF REFERENCE NUMERALS

| | |
|---|---|
| 10, 20, 30 | Lens-mounted light emitting unit |
| 11 | Base plate |
| 12 | LED element |
| 13, 33 | Lens unit |
| 14a | Emitting surface |
| 14b | Reflecting surface |
| 14c | Side incident surface |
| 14d, 34d | Upper incident surface |

MODES FOR CARRYING OUT THE INVENTION

Figure 1:
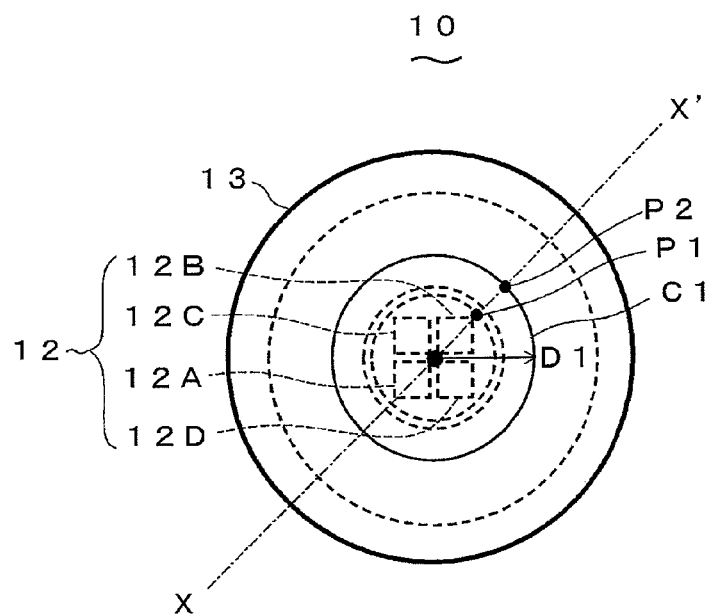
FIG. 1 is a top plan view of a lens-mounted light emitting unit according to a first embodiment of the present embodiment.
Figure 2A:
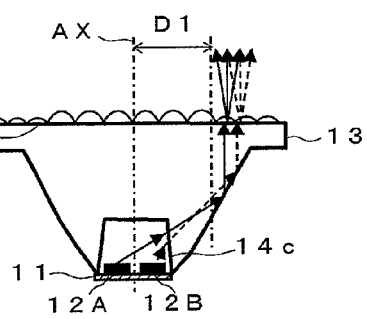
Figure 2B:
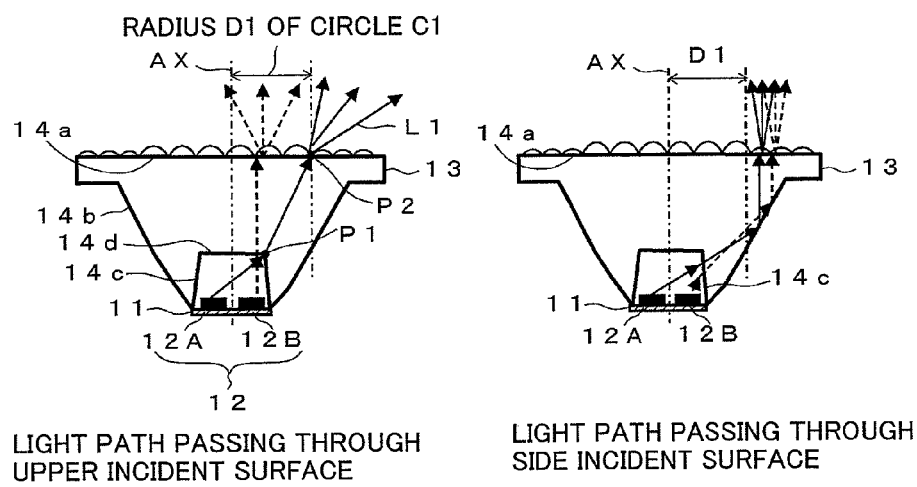
FIG. 2B is a cross-sectional view showing light path passing through a side incident surface.

Hereinafter, a lens-mounted light emitting unit according to a first embodiment embodying the present invention will be described. FIG. 1 shows a top face of the lens-mounted light emitting unit of the present embodiment, while FIGS. 2A and 2B show cross-sections of the unit. In the Figures, hatching of the lens cross-sections is omitted (the same applies hereinafter). The lens-mounted light emitting unit with lens 10 comprises: a base plate 11; multiple LED elements 12A to 12D (collectively referred to as LED elements 12) placed on the base plate 11; and a lens unit 13 having a shape of a body of revolution about a normal line of the base plate 11 as a symmetry axis of revolution which passes through substantially the center of gravity of the multiple LED elements 12. The multiple LED elements 12 include LED elements 12 of multiple light colors, while the lens unit 13 color-mixes and emits the light from the LED elements 12.

The base plate 11 is a plate using glass epoxy, aluminum and so on as a base material, and is provided with a wiring pattern of the LED elements 1 so as to serve as a surface to place the LED elements 12 on. The LED elements 12 are semiconductor elements which emit light when a voltage is applied thereto in a forward direction. The light colors of the multiple LED elements 12A to 12D are, for example, red (R), blue (B), green (G), yellow (Y), or the like, respectively. They can have all different light colors from one another in this way, or can include LED elements of the same light color. It is possible to house the multiple LED elements in one package so as to form and use a light emitting diode package. The lens unit 13 is made of a light transparent material such as acryl or glass, while having a function to collect and a function to diffuse light from the LED elements 12 by being placed in front of the LED elements 12.

The lens unit 13 is a condenser lens. The condenser lens is described in Japanese Laid-open Patent Publication Sho 60-130001, and comprises: an emitting surface 14a perpendicular to the normal line of the base plate 11; a reflecting surface 14b extending convexly toward the base plate 11 from the emitting surface 14a; a side incident surface 14c which is replicated toward the emitting surface 14a from an end of the base plate 11 side of the reflecting surface 14b; and an upper incident surface 14d which bounds an end of the side incident surface 14c which does not contact with the reflecting surface 14b. The emitting surface 14a is a surface designed to extract light incident on the lens unit 13 out of the lens unit 13. The emitting surface 14a is provided with a diffusion function by attaching a diffusion sheet thereto, or forming a concavo-convex shape thereon, or the like. The reflecting surface 14b is a total reflection surface, i.e. a surface such that the tilt of the surface is designed to allow the incident angle to be equal to or larger than the critical angle so that when the light is incident on a medium with a lower refractive index from a medium with a higher refractive index, all the incident light is reflected without passing through the boundary surface between the different media. A reflective material can be provided on the reflecting surface 14b to further prevent light leakage. Examples of the reflective material are those having silver deposited thereon, or treated with multiple layers, or the like. The side incident surface 14c is a surface designed to allow substantially all the incident light to reach the reflecting surface 14b by being substantially perpendicular to the surface to place the LED elements on. The upper incident surface 14d is substantially parallel to the surface to place the LED elements 12 on, and is a surface designed to allow substantially all the incident light thereon to reach the emitting surface 14a.

Assuming an arbitrary contact point P1 between the side incident surface 14c and the upper incident surface 14d, and that light from an LED element 12A farthest from the contact point P1 is refracted at the contact point P1 to form a light path L1 intersecting the emitting surface 14a at an intersection point P2, the emitting surface 14a inside a circle C1 with a radius D1 formed by continuously connecting such intersection points has a diffusion angle ($\alpha$) larger than the diffusion angle ($\beta$) of the emitting surface 14a outside the circle C1. The diffusion angle is an angle at which emitted light is diffused when parallel light is incident. This angle is defined by a half beam angle of center intensity. As a means to allow the emitting surface 14a to have different diffusion angles, it is possible to use a diffusion sheet having a micro-order concavo-convex shape formed on the surface thereof to have different diffusion angles, or to use a diffusion sheet with different diffusion angles based on concentrations of a diffusion material. It is also possible to form a differently shaped concavo-convex shape directly on the surface of the lens unit 13. The concavo-convex shape can be spherical-shaped, or can be formed by axially rotating elliptic, hyperbolic, parabolic, or sine curves.

Figure 3A:
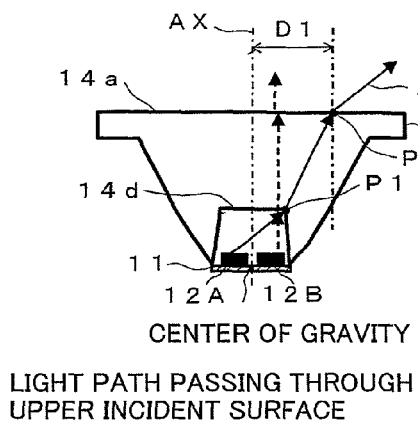
Figure 3B:
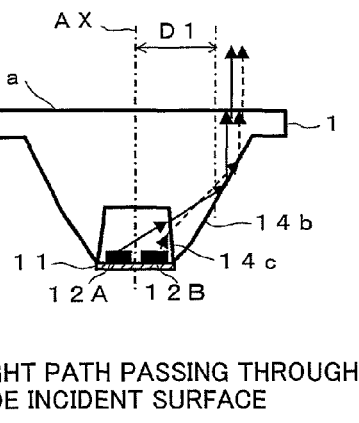
FIG. 3B is a cross-sectional view showing light path passing through the side incident surface in this case.

Here, the case where the diffusion means of the present embodiment is absent from the emitting surface 14a will be described. FIGS. 3A and 3B show light path in the case where the diffusion means of the present embodiment is absent from the emitting surface 14a. As shown in FIG. 3B, light emitted from the LED elements 12 and passing through the side incident surface 14c is totally reflected once by the reflecting surface 14b in the lens 13 so as to be substantially parallel to the lens center axis AX and emitted through the emitting surface 14a outside the circle C1 with the radius D1. In this light path, there is almost no offset of light distribution between the light emitted from the different LED elements 12A, 12B. In contrast, as shown in FIG. 3A, light emitted from the LED elements 12 and passing through the upper incident surface 14d is emitted as light distribution of the LED elements themselves through the emitting surface 14a inside the circle C1. In this light path, positional offsets of the different LED elements 12A, 12B from the lens center axis AX cause offset of light distribution. The offset of light distribution causes poor color mixing of light from the multiple LED elements 12A, 12B which emit mutually different color light, thus causing color unevenness in the case where the diffusion means of the present embodiment is absent.

On the other hand, the case where the diffusion means of the present embodiment is present on the emitting surface 14a will be described. FIGS. 2A and 2B show light path in the case where the diffusion means of the present embodiment is present on the emitting surface 14a. As shown in FIG. 2B, light emitted from the LED elements 12 and passing through the side incident surface 14c is totally reflected by the reflecting surface 14b so as to be emitted through the emitting surface 14a outside the circle C1. In this light path, the diffusion of light at the emitting surface 14a is reduced because the diffusion angle of the emitting surface 14a outside the circle C1 is not made large, so that the light distribution is not widened more than necessary. In contrast, as shown in FIG. 2A, light emitted from the LED elements 12 and passing through the upper incident surface 14d is emitted through the emitting surface 14a inside the circle C1. This light does not travel via the reflecting surface 14b, causing poor color mixing properties, so that the diffusion angle of the emitting surface 14a inside the circle C1 is made large. Thus, in this light path, the light is diffused at the emitting surface 14a, thereby improving the color mixing properties.

Figure 4A:
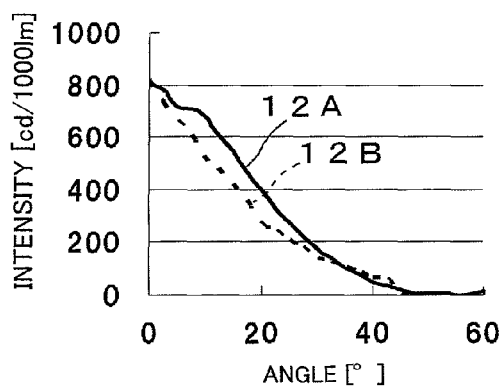
Figure 4B:
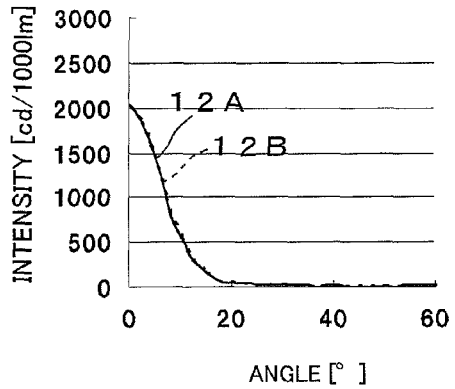
FIG. 4B is a graph of light distribution curves of light passing through the emitting surface outside the circle in the unit.
Figure 5A:
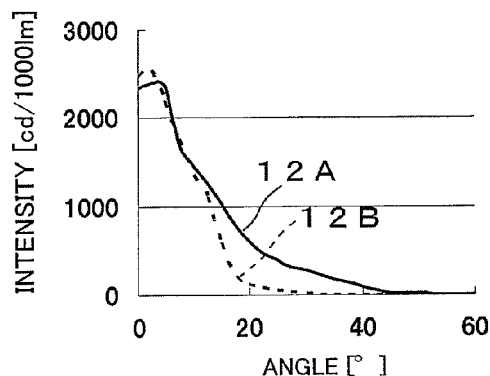
Figure 5B:
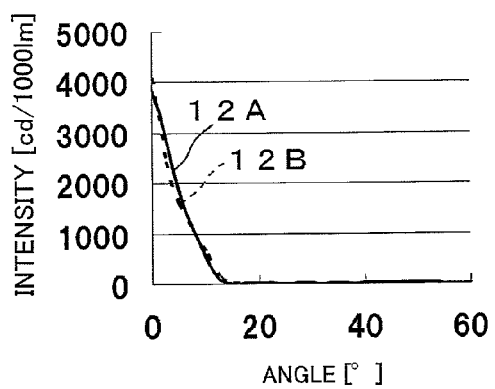
FIG. 5B is a graph of light distribution curves of light passing through the emitting surface outside the circle in this case.

Next, light distribution curves of light emitted from the lens-mounted light emitting unit 10 will be described. A light distribution curve shows an intensity distribution of a light source or fixture in each direction in space. FIGS. 4A and 4B show light distribution curves in the case where the diffusion means of the present embodiment is present, while FIGS. 5A and 5B show light distribution curves in the case where the diffusion means of the present embodiment is absent, in which the horizontal axis represents angle of the emitted light from the lens center axis AX, while the vertical axis represents intensity at each angle. FIG. 4A and FIG. 5A show the case where the light passes through the emitting surface 14a inside the circle C1, while FIG. 4B and FIG. 5B show the case where the light passes through the emitting surface 14a outside the circle C1. A comparison of FIG. 4A and FIG. 5A indicates that in the case where the light passes through the emitting surface 14a inside the circle C1, the difference between the light distribution curves of the LED elements 12A, 12B is smaller in the presence of the diffusion means of the emitting surface 14a than in its absence. Further, FIG. 4B and FIG. 5B show that in the case where the light passes through the emitting surface 14a outside the circle C1, the difference between the light distribution curves of the LED elements 12A, 12B is small regardless of the presence or absence of the diffusion means, in which the light distribution is hardly widened by the presence of the diffusion means of the emitting surface 14a.

Thus, according to the lens-mounted light emitting unit 10 of the present embodiment, in the light reflected by the reflecting surface 14b of the lens unit 13, there is almost no offset of light distribution between the light emitted from the different LED elements 12A, 12B, so that the diffusion angle of the area of the emitting surface 14a to emit the reflected light is not made large, thereby enabling narrow-angle light distribution. Further, in the light passing through the upper incident surface 14d of the lens unit 13, the respective positional offsets of the different LED elements 12A, 12B from the lens center axis AX cause offset of light distribution, so that the diffusion angle of the area of the emitting surface 14a to emit such light is made large, thereby making it possible to improve the color mixing properties and prevent color unevenness. In other words, sufficient color mixing of light incident on the supper incident surface 14d is achieved while enabling narrow-angle light distribution by the condenser lens, making it possible to improve the color mixing properties of the lens-mounted light emitting unit 10.

Figure 6:
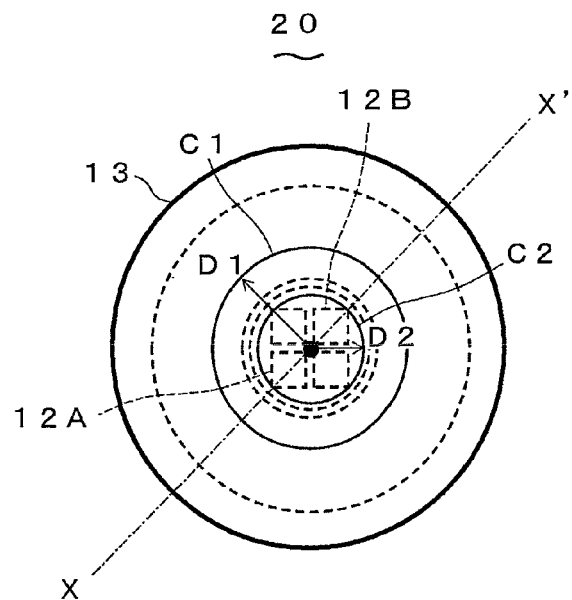
FIG. 6 is a top plan view of a lens-mounted light emitting unit according to a second embodiment of the present embodiment.
Figure 7:
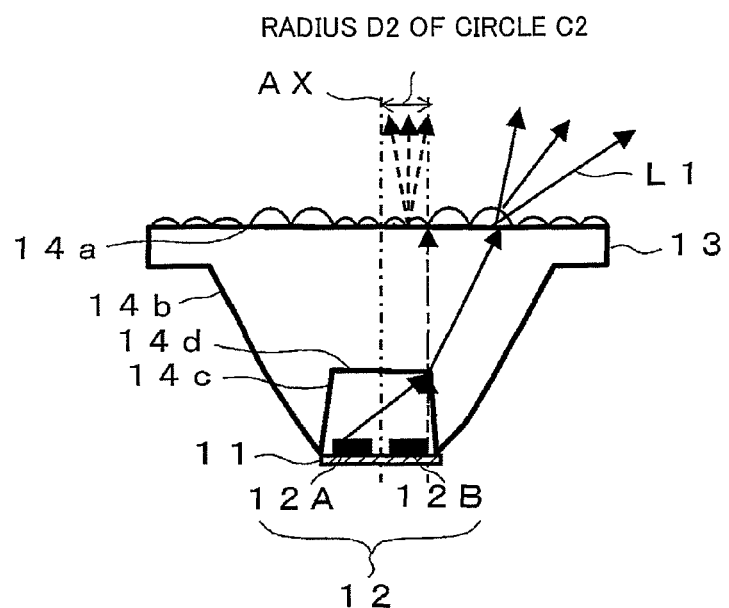
FIG. 7 is a cross-sectional view of the unit along line X-X' of FIG. 6.

Next, a lens-mounted light emitting unit according to a second embodiment embodying the present invention will be described. FIG. 6 shows a top face of the lens-mounted light emitting unit of the present embodiment, while FIG. 7 shows a cross-section of the unit. The lens-mounted light emitting unit 20 of the present embodiment has a similar structure as in the first embodiment, and the upper incident surface 14d is a flat surface perpendicular to a normal line of the base plate 11, while the diffusion angle of the emitting surface 14a inside the circle C1 is made larger in a peripheral area of the circle C1 than in a central area of the circle C1. More specifically, assuming that a circle formed by continuously connecting points on the emitting surface 14a, which are reached by the light from the LED elements passing through the upper incident surface 14d and substantially parallel to the lens center axis AX, is a circle C2 at a distance D2 from the lens center, the emitting surface 14a outside the circle C2 and inside the circle C1 has a diffusion angle larger than the diffusion angle thereof inside the circle C2.

Figure 8A:
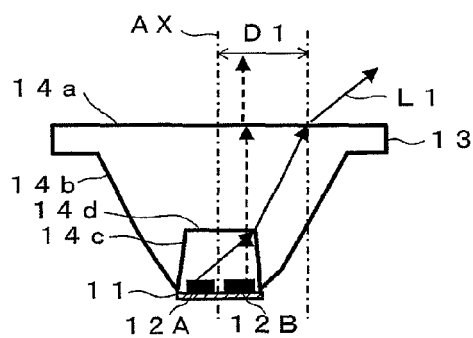
Figure 8B:
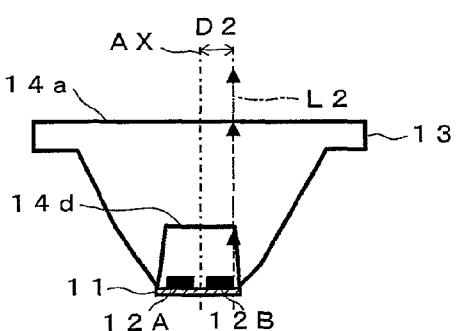
FIG. 8B is a cross-sectional view showing light path passing through the upper incident surface and substantially in parallel to the lens center axis in this case.

Here, the case where the diffusion means of the present embodiment is absent from the emitting surface 14a will be described. FIGS. 8A and 8B show light path in the case where the diffusion means of the present embodiment is absent from the emitting surface 14a. As shown in FIG. 8A, the circle C1 with the radius D1 is similar as in the first embodiment. In contrast, as shown in FIG. 8B, light L2 emitted from the LED elements 12 and substantially parallel to the lens center axis AX is perpendicularly incident on the upper incident surface 14d, and thus does not change in the emission angle at the boundary surface (upper incident surface 14d) according to Snell's Law for the refractive index n and refractive angle θ (n·sin θ=n'·sin θ'), and reaches the emitting surface 14a, while being kept substantially parallel to the lens center axis AX, so as to be emitted therefrom. The LED elements 12 output a substantially constant intensity in the light emitting surface area, in which the light distribution shape is a substantially Lambertian shape, so that in this light path, if the multiple LED elements 12 are closely placed symmetrically with respect to the center axis, the color mixing properties in the vicinity of the lens center axis AX are improved.

On the other hand, the case where the diffusion means of the present embodiment is present on the emitting surface 14a will be described. FIG. 7 shows light path in the case where the diffusion means of the present embodiment is present on the emitting surface 14a. Light emitted from the LED elements 12 and substantially parallel to the lens center axis AX does not change in the emission angle at the upper incident surface 14d, and reaches the emitting surface 14a inside the circle C2 so as to be emitted therefrom. This light has good color mixing properties, so that the diffusion angle of the emitting surface 14a inside the circle C2 is not made large. Thus, in this light path, the diffusion of light at the emitting surface 14a is reduced, so that the light distribution is not widened more than necessary. Further, light emitted from the LED elements 12 and passing through the upper incident surface 14d and not substantially parallel to the lens center axis AX is emitted through the emitting surface 14a outside the circle C2 and inside the circle C1. This light changes in the emission angle at the upper incident surface 14d, causing poor color mixing properties, so that the diffusion angle of the emitting surface 14a outside the circle C2 and inside the circle C1 is made large. Thus, in this light path, the light is diffused at the emitting surface 14a, thereby improving the color mixing properties.

Figure 9A:
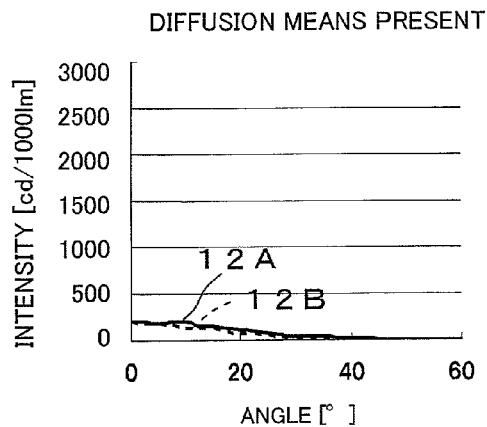
Figure 9B:
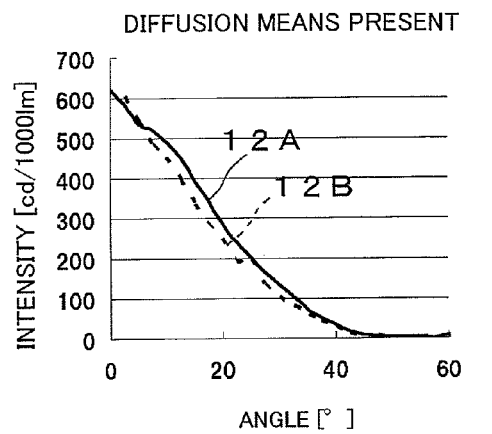
FIG. 9B is a graph of light distribution curves of light passing through the emitting surface inside the circle in a peripheral area thereof in the unit.
Figure 10A:
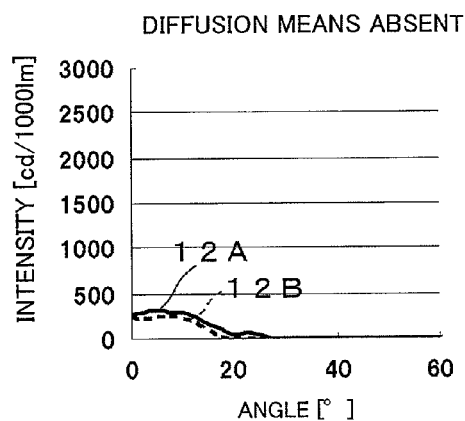
Figure 10B:
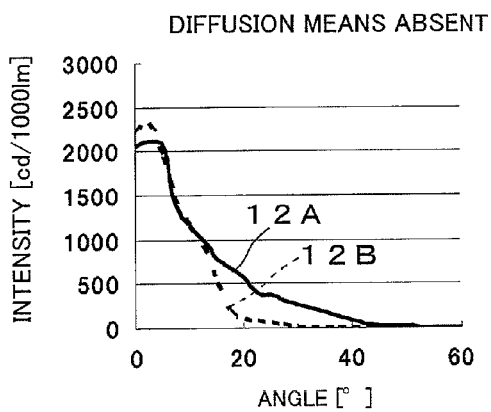
FIG. 10B is a graph of light distribution curves of light passing through the emitting surface inside the circle in the peripheral area thereof in this case.

Next, light distribution curves of light emitted from the lens-mounted light emitting unit 20 of the present embodiment will be described. FIGS. 9A an 9B show light distribution curves in the case where the diffusion means of the present embodiment is present, while FIGS. 10A and 10B show light distribution curves in the case where the diffusion means of the present embodiment is absent. FIG. 9A and FIG. 10A show the case where the light passes through the emitting surface 14a inside the circle C2, while FIG. 9B and FIG. 10B show the case where the light passes through the emitting surface 14a outside the circle C2 and inside the circle C1. FIG. 9A and FIG. 10A show that in the case where the light passes through the emitting surface 14a inside the circle C2, the difference between the light distribution curves of the LED elements 12A, 12B is small regardless of the presence or absence of the diffusion means, in which the light distribution is hardly widened by the presence of the diffusion means of the emitting surface 14a. Further, a comparison of FIG. 9B and FIG. 10B indicates that in the case where the light passes through the emitting surface 14a outside the circle C2 and inside the circle C1, the difference between the light distribution curves of the LED elements 12A, 12B is smaller in the presence of the diffusion means of the emitting surface 14a than in its absence.

Thus, in the case where the upper incident surface 14d is a flat surface, light L2 incident on the upper incident surface 14d substantially in parallel to the lens center axis AX is emitted from the emitting surface 14a in the vicinity of the lens center axis AX while being kept substantially in parallel, in which the close placement of the multiple LED elements 12A, 12B symmetrical with respect to the center axis allows good color mixing properties, so that the diffusion angle of the emitting surface 14a in the vicinity of the lens center axis AX is not made large, whereby it is possible to prevent the light distribution from being widened more than necessary. Further, the other light passing through the upper incident surface 14d causes poor color mixing properties, so that the diffusion angle of the area of the emitting surface 14a to emit such light is made large, thereby making it possible to improve the color mixing properties and prevent color unevenness. In other words, the case where the upper incident surface 14d is a flat surface perpendicular to a normal line of the base plate 11 allows good color mixing properties at lens center, so that by reducing diffusion of such area, it is possible to improve the light collecting properties.

Figure 11:
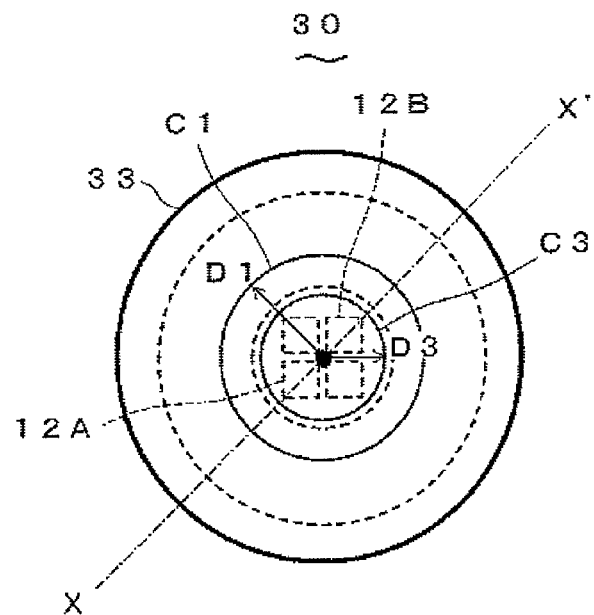
FIG. 11 is a top plan view of a lens-mounted light emitting unit according to a third embodiment of the present embodiment.
Figure 12:
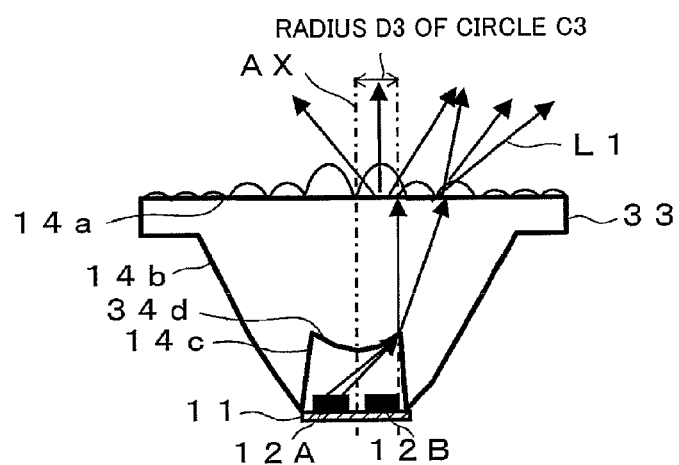
FIG. 12 is a cross-sectional view of the unit along line X-X' of FIG. 11.

Next, a lens-mounted light emitting unit according to a second embodiment embodying the present invention will be described. FIG. 11 shows a top face of the lens-mounted light emitting unit of the present embodiment, while FIG. 12 shows a cross-section of the unit. The lens-mounted light emitting unit 30 of the present embodiment has a similar structure as in the first embodiment, and an upper incident surface 34d is a convex surface perpendicular to a normal line of the base plate 11, while the diffusion angle of the emitting surface 14a inside the circle C1 is smaller in a peripheral area of the circle C1 than in a central area of the circle C1. More specifically, assuming that a circle formed by continuously connecting points on the emitting surface 14a, which are reached by the light from the LED elements passing through the upper incident surface 34d and substantially parallel to the lens center axis AX, is a circle C3 at a distance D3 from the lens center, the emitting surface 14a outside the circle C3 and inside the circle C1 is has a diffusion angle smaller than the diffusion angle thereof inside the circle C3. The upper incident surface 34d has a downward convex shape, forming a convex lens.

Figure 13A:
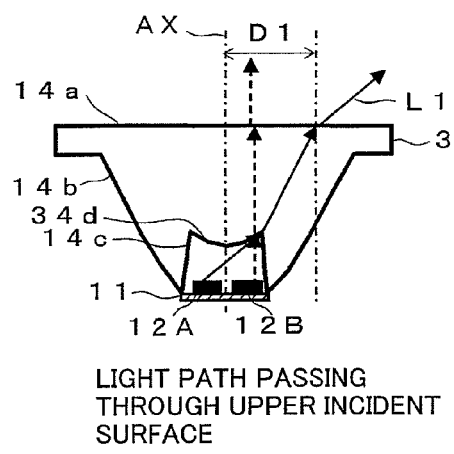
Figure 13B:
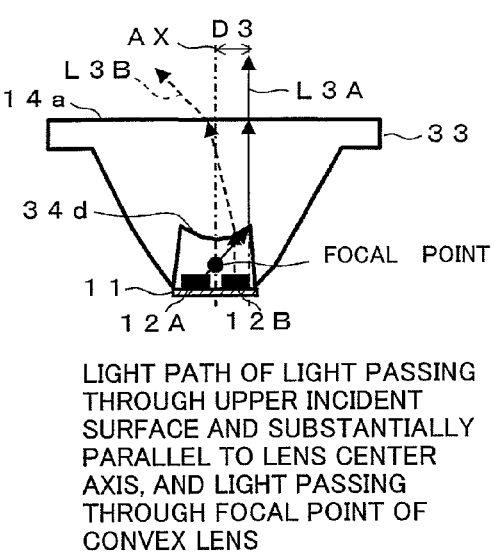
FIG. 13B is a cross-sectional view showing light path of light passing through the upper incident surface and substantially in parallel to the lens center axis, and light passing through the focal point of a convex lens in this case.

Here, the case where the diffusion means of the present embodiment is absent from the emitting surface 14a will be described. FIGS. 13A and 13B show light path in the case where the diffusion means of the present embodiment is absent from the emitting surface 14a. As shown in FIG. 13A, the circle C1 with the radius D1 is similar as in the first embodiment. In contrast, as shown in FIG. 13B, light L3A emitted from the LED elements 12 and incident from near a focal point of the upper incident surface 34d (convex lens) is refracted into light substantially parallel to the lens center axis AX. Light L3B emitted from the LED elements 12 and substantially parallel to the lens center axis AX is collected at the focal point. Thus, the light is collected within the periphery of the convex shape so as to be emitted from the emitting surface 14a, while in this light path, the difference between the light distribution shapes of light from the different LED elements 12A, 12B becomes large.

On the other hand, the case where the diffusion means of the present embodiment is present on the emitting surface 14a will be described. FIG. 12 shows light path in the case where the diffusion means of the present embodiment is present on the emitting surface 14a. The light emitted from the different LED element 12A, 12B and emitted through the emitting surface 14a inside the circle C3 causes the large difference in the light distribution shape from each other, so that diffusion angle of the emitting surface 14a inside the circle C3 is made large. Thus, in this light path, the light is diffused at the emitting surface 14a, thereby improving the color mixing properties. Further, the diffusion angle of the emitting surface 14a outside the circle C3 and inside the circle C1 is made small, so that the diffusion of light at the emitting surface 14a is reduced, thereby preventing the light distribution from being widened more than necessary.

Figure 14A:
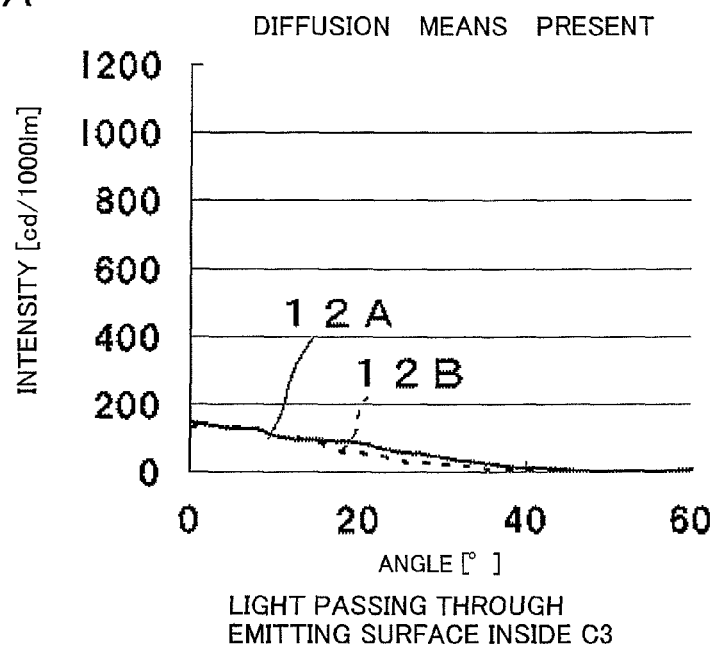
Figure 14B:
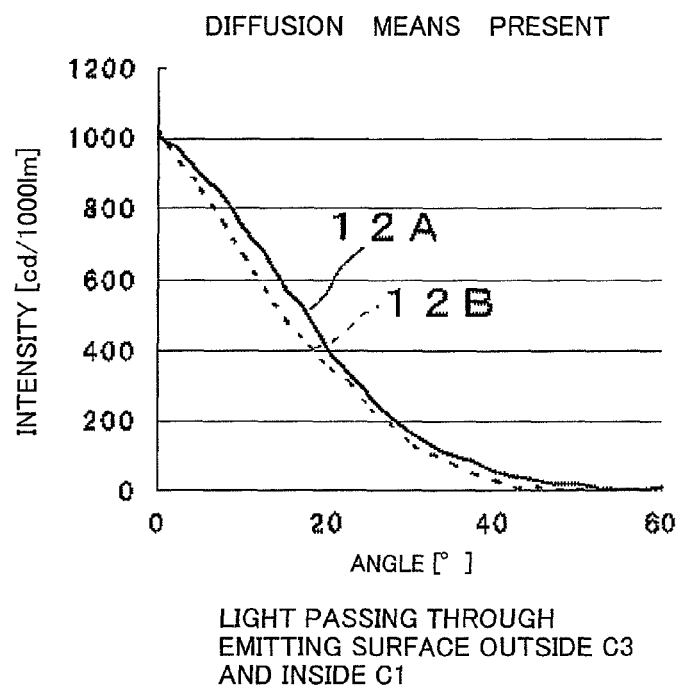
FIG. 14B is a graph of light distribution curves of light passing through the emitting surface inside the circle in a peripheral area thereof in the unit.
Figure 15A:
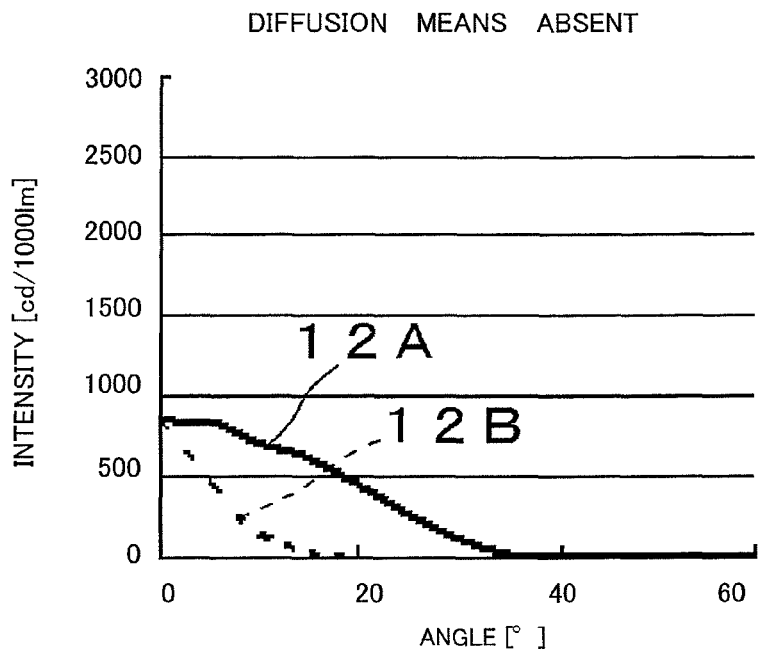
Figure 15B:
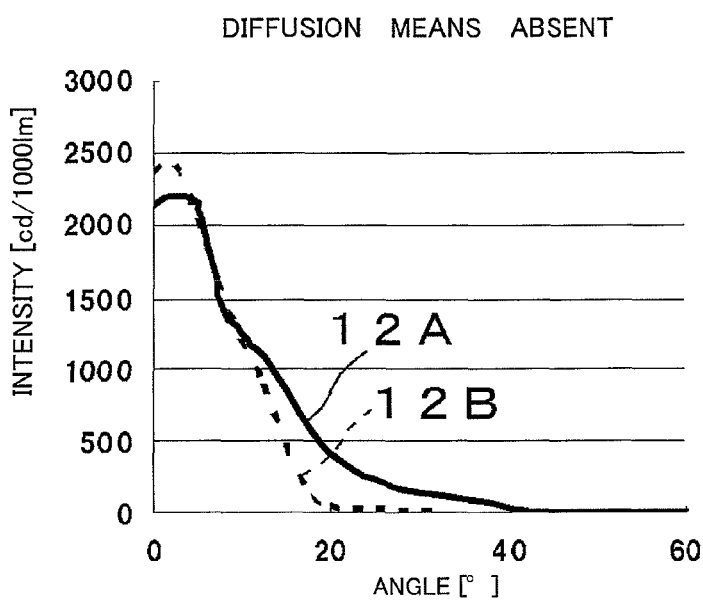
FIG. 15B is a graph of light distribution curves of light passing through the emitting surface inside the circle in the peripheral area thereof in this case.

Next, light distribution curves of light emitted from the lens-mounted light emitting unit 30 of the present embodiment will be described. FIGS. 14A an 14B show light distribution curves in the case where the diffusion means of the present embodiment is present, while FIGS. 15A and 15B show light distribution curves in the case where the diffusion means of the present embodiment is absent. FIG. 14A and FIG. 15A show the case where the light passes through the emitting surface 14a inside the circle C3, while FIG. 14B and FIG. 15B show the case where the light passes through the emitting surface 14a outside the circle C3 and inside the circle C1. A comparison of FIG. 14A and FIG. 15A indicates that in the case where the light passes through the emitting surface 14a inside the circle C3, the difference between the light distribution curves of the LED elements 12A, 12B is smaller in the presence of the diffusion means of the emitting surface 14a than in its absence. Further, FIG. 14B and FIG. 15B show that in the case where the light passes through the emitting surface 14a outside the circle C3 and inside the circle C1, the difference between the light distribution curves of the LED elements 12A, 12B is relatively small regardless of the presence or absence of the diffusion means, in which the light distribution is not much widened by the presence of the diffusion means of the emitting surface 14a.

Thus, in the case where the upper incident surface 34d is a convex surface, the light L3A incident on the upper incident surface 34d from near the focal point of the focal point of the convex lens formed by the convex surface becomes substantially parallel to the lens center axis AX, while the light L3B incident in parallel to the lens center axis AX is collected at the focal point. Both of them are emitted from the emitting surface 14a in the vicinity of the lens center axis AX, in which the difference between the light distribution shapes from the different LED elements 12A, 12B is large, causing poor mixing properties, so that the diffusion angle of the emitting surface 14a in the vicinity of the lens center axis AX is made large, thereby making it possible to improve the color mixing properties and prevent color unevenness. Further, the other light passing through the upper incident surface 34d does not cause poor color mixing properties, so that the diffusion angle of the area of the emitting surface 14a to emit such light is made small, thereby making it possible to prevent the light distribution from being widened more than necessary. In other words, the case where the upper incident surface 34d is a convex surface perpendicular to a normal line of the base plate 11 causes the light substantially parallel to the lens center axis to increase, resulting in light collection offset from the lens center axis AX and thus in most poor color mixing properties. However, it is possible to improve the color mixing properties at a minimum diffusion angle by increasing the diffusion in a central area of the circle C1 and by reducing the diffusion in a peripheral area of the circle C1.

Figure 16A:
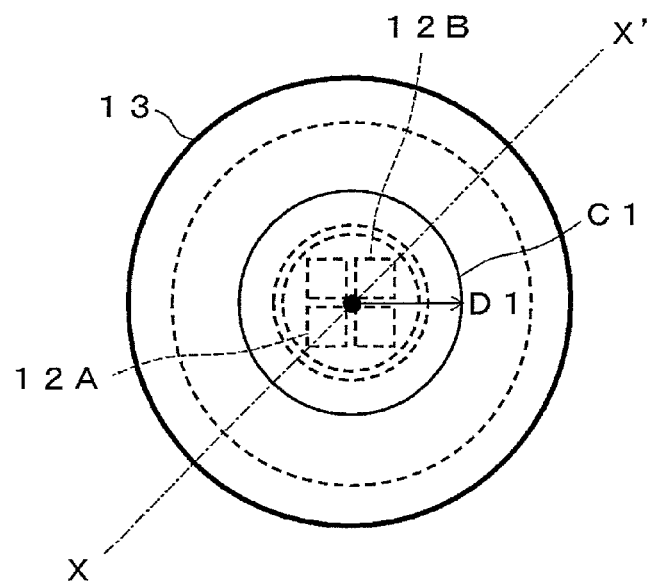
Figure 16B:
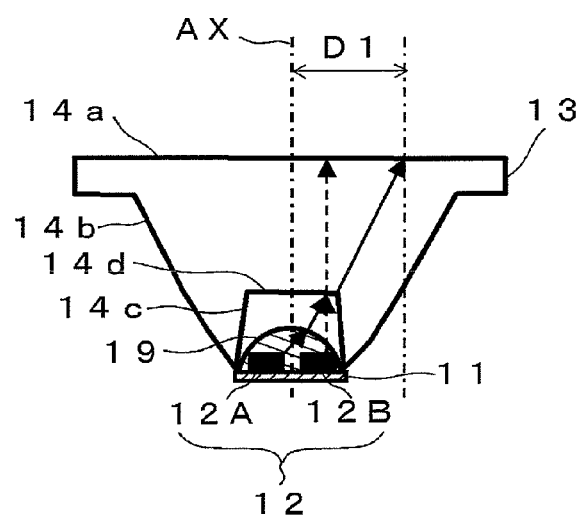
FIG. 16B is a cross-sectional view along line X-X' of the modified example.

Next, a modified example of the lens-mounted light emitting units 10, 20, 30 of the present invention will be described. FIG. 16A shows a top face of the lens-mounted light emitting unit, while FIG. 16B a cross-section of the unit. In order to improve the light extraction efficiency of the LED elements 12, a silicone-like sealing cap 19 may be provided on the emitting surface side of the base plate 11. By allowing this sealing cap 19 to be hemispherically shaped, the light distribution shapes of the LED elements 12 become a substantially Lambertian shape although the light is collected to some extent, so that the features of the respective embodiments described above can be applied as is.

It is to be noted that the present invention is not limited to the structures of the above embodiments, and various modifications are possible. For example, the light colors of the LED elements 12 are not limited to four colors, and can be three colors using three LED elements 12.

The present invention is based on Japanese Patent Application 2008-113516, the content of which is incorporated into the present invention by reference to the specification and the drawings of the above patent application.

The present invention has been sufficiently described by the embodiments with reference to the attached drawings, but it would be obvious to a person of ordinary skill in the art that various changes and modifications are possible. Accordingly, such changes and modifications should be construed to fall within the scope of the present invention without departing from the scope of the present invention.

The invention claimed is:

1. A lens-mounted light emitting unit comprising:
a base plate;
multiple LED elements placed on the base plate; and
a lens unit having a shape of a body of revolution about a normal line of the base plate as a symmetry axis of revolution which passes through substantially the center of gravity of the multiple LED elements, in which the multiple LED elements include LED elements of multiple light colors, while the lens unit color-mixes and emits light from the LED elements,
wherein the lens unit comprises: an emitting surface perpendicular to the normal line of the base plate; a reflecting surface extending convexly toward the base plate from the emitting surface; a side incident surface which is replicated toward the emitting surface from an end of the base plate side of the reflecting surface; and an upper incident surface which bounds an end of the side incident surface which does not contact the reflecting surface,
contact points between the side incident surface and the upper incident surface,
intersection points at which light paths from an LED element refracted at the contact points intersect the emitting surface, the LED element farthest from a respective contact point,
a circle is formed by continuously connecting such intersection points,
the emitting surface is configured to allow different diffusion angles inside the circle from outside the circle, so that the diffusion angles inside the circle are larger than the diffusion angles outside the circle, and
the structure of the emitting surface having different diffusion angles includes one of a diffusion sheet attached to the emitting surface and a concave-convex shape formed on the emitting surface.

2. The lens-mounted light emitting unit according to claim 1,
wherein the upper incident surface is a flat surface perpendicular to the normal line, and
wherein the diffusion angles of the emitting surface inside the circle are larger in a peripheral area of the circle than in a central area of the circle.

3. The lens-mounted light emitting unit according to claim 1,
wherein the upper incident surface is a convex surface perpendicular to the normal line, and
wherein the diffusion angles of the emitting surface inside the circle are smaller in a peripheral area of the circle than in a central area of the circle.

* * * * *